United States Patent [19]

Weiss et al.

[11] 4,170,662
[45] Oct. 9, 1979

[54] PLASMA PLATING

[75] Inventors: Armin K. Weiss; John R. Clarke, both of Rochester, N.Y.

[73] Assignee: Eastman Kodak Company, Rochester, N.Y.

[21] Appl. No.: 871,314

[22] Filed: Jan. 23, 1978

Related U.S. Application Data

[63] Continuation-in-part of Ser. No. 688,663, May 21, 1976, abandoned, which is a continuation-in-part of Ser. No. 636,394, Dec. 1, 1975, abandoned, which is a continuation-in-part of Ser. No. 521,011, Nov. 5, 1974, abandoned.

[51] Int. Cl.$^2$ .............................................. B05D 3/06
[52] U.S. Cl. .................................. 427/38; 96/1.5 R; 204/192 N
[58] Field of Search ............................ 427/38, 39, 40; 204/192 N; 96/1.5

[56] References Cited

U.S. PATENT DOCUMENTS

| | | | |
|---|---|---|---|
| 3,307,983 | 3/1967 | De Haan et al. | 96/1.5 |
| 3,369,991 | 2/1968 | Davidse et al. | 96/1.5 |
| 3,419,487 | 12/1968 | Robbins et al. | 427/38 |
| 3,525,680 | 8/1970 | Davidse et al. | 96/1.5 |
| 3,604,970 | 9/1971 | Culbertson et al. | 427/39 |
| 3,639,151 | 2/1972 | Krutenat | 427/39 |
| 3,673,071 | 6/1972 | Prischard et al. | 96/1.5 |
| 4,019,902 | 4/1977 | Leder et al. | 96/1.5 |

FOREIGN PATENT DOCUMENTS 868514  4/1971  Canada .
889981  1/1972  Canada .

OTHER PUBLICATIONS

Vossen et al. I, "RCA Review", Dec. 1968, pp. 566–581.
Vossen et al. II, "RCA Review", Jun. 1970, pp. 293–305.
Leder, "Metal Finishing", Mar. 1974, pp. 41–45.
Mattox, "J. Vac. Sci. Technol.", Vol. 10, No. 1, Jan.-/Feb. 1973, pp. 47–52.

Primary Examiner—John H. Newsome
Attorney, Agent, or Firm—Warren W. Kurz

[57] ABSTRACT

A method for forming on a substrate a relatively thick, densified, essentially non-porous, fine-grained layer of a non-conductive material. The method comprises the steps of vapor depositing onto such substrate a starting material while simultaneously bombarding the substrate with ions of a preselected gas. During the process, the substrate is disposed in the atmosphere of a preselected gas, and an RF field is established between the substrate and an opposing electrode structure to produce a plasma of such gas in the vicinity of the substrate. The substrate is electrically biased to attract ions from the plasma, such ions serving to impact on the substrate and thereby densify the vapor deposit thereon. Preferably, the starting material is one which reacts with the gas ions to form the desired material on the substrate; alternatively, the starting material comprises the desired material, in which case the gas plasma preferably comprises an inert gas.

8 Claims, 1 Drawing Figure

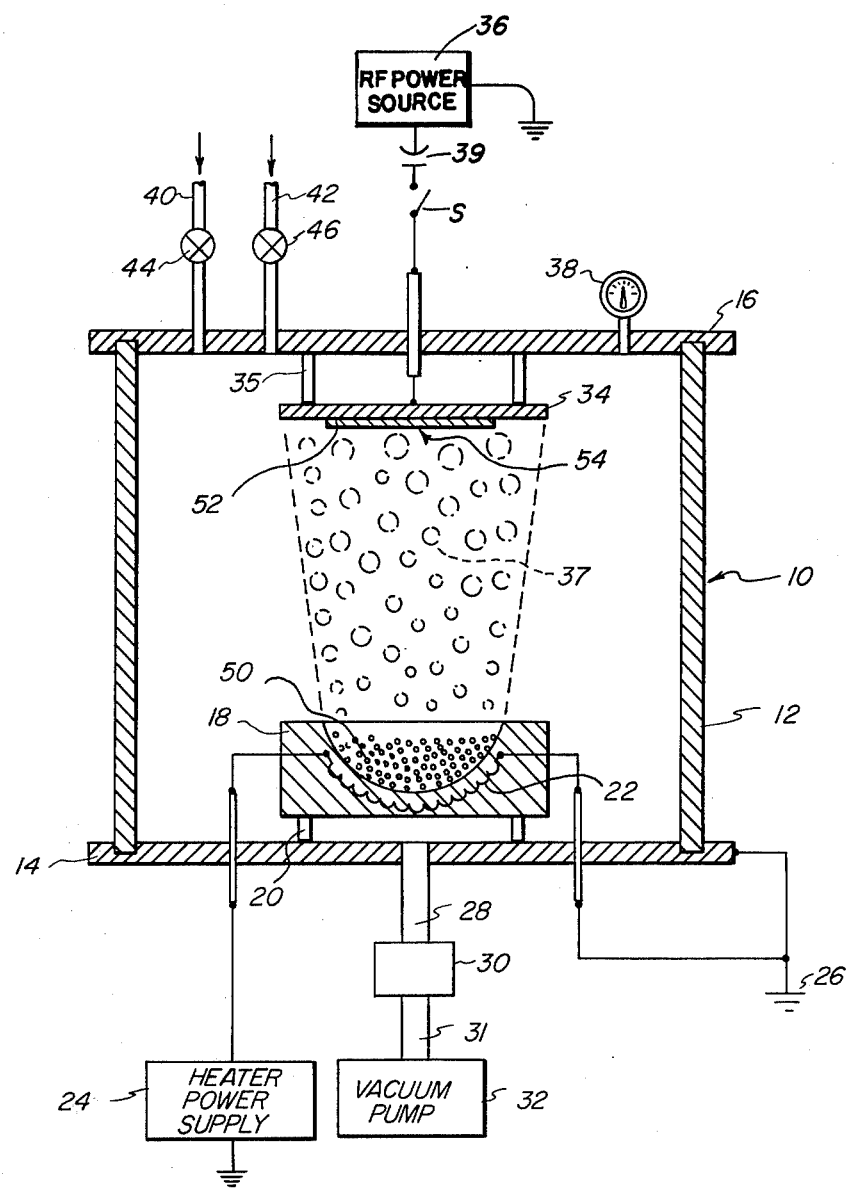

PLASMA PLATING

CROSS-REFERENCE TO RELATED APPLICATIONS

This application is a continuation-in-part of commonly assigned U.S. patent application Ser. No. 688,663, entitled "Method for Plasma-Plating a Photoconductive Material onto the Surface of a Substrate", filed May 21, 1976 in the names of Armin K. Weiss and John R. Clarke, which, in turn, is a continuation-in-part of commonly assigned U.S. patent application Ser. No. 636,394, entitled "Method for Plasma-Plating a Dielectric Material onto the Surface of a Substrate", filed Dec. 1, 1975 in the name of Armin K. Weiss, which, in turn, is a continuation-in-part of commonly assigned U.S. patent application Ser. No. 521,011, entitled "Method for Plasma-Plating a Photoconductive Material onto the Surface of a Substrate", filed Nov. 5, 1974 in the name of Armin K. Weiss all of the above applications now abandoned.

BACKGROUND OF THE INVENTION

1. Field of the Invention

This invention relates to improvements in plasma plating and, more particularly, to a method for forming on a substrate surface thick, binderless, essentially non-porous, fine-grained layers of non-conductive materials. The term "non-conductive", as used herein, refers to materials having a volume resistivity of more than $10^6$ ohm-cm. Such materials include semiconductive and photoconductive materials, in addition, of course, to dielectric materials.

2. Description of the Prior Art

In certain electrophotographic and electroradiographic recording processes, it is desirable that the recording element comprise a binderless, thick (i.e. more than 10 micrometers), cohesive, adhesive, non-porous and fine-grained layer of a photoconductive composition. Such a photoconductive layer will exhibit good mechanical integrity, a low dark current conductance, and a high absorption of activating radiation due to its dense structure and thickness. These characteristics are particularly advantageous in electroradiographic applications.

A number of methods are known in the prior art for depositing binderless materials on the surface of a supporting substrate. In one method, commonly known as "vapor deposition", the material to be deposited is placed in a heated crucible arranged within an evacuated chamber and heated to a temperature sufficient to evaporate such material. The substrate is arranged in a position over the crucible and in a spaced relation thereto so that the evaporated material is carried to and deposited on the facing surface of the substrate. While relatively thick layers can be deposited by this technique, there is a tendency, especially with certain photoconductive compounds, for the vapor deposited layer to be relatively coarse in structure, exhibiting an open sieve-like pattern with poor adhesion to its substrate and poor cohesion to itself.

In another method, commonly known as "sputtering", a starting material (i.e. the material which is to be deposited) is arranged within an evacuated chamber in spaced relation to the receiving substrate. Typically, the substrate is arranged on a grounded electrode, and the chamber is back-filled with a gas at low pressure. The starting material is positioned on a conductive electrode to which a source of potential is applied. The potential source serves both to produce a gas plasma between the spaced electrodes, and to cause gas ions from the plasma to bombard the surface of the starting material. Such ion bombardment acts to break or knock off atoms or molecules of the starting material, causing them to fly in all directions. Some of these atoms or molecules of the starting material settle on the substrate to form a layer. While the sputtering method has been successfully used for producing relatively dense layers on a substrate, it is basically inefficient and, hence, its use has been limited to the production of layers having a thickness of less than 10 micrometers ($\mu$m). Such thin layers are unsuitable for radiographic applications.

In still another method, commonly known as "ion plating", a conductive starting material is placed within an evacuated chamber opposite a conductive receiving substrate. A high voltage DC field is produced between the starting material and the substrate, the latter being the cathode of a high voltage DC circuit, and the chamber is then back-filled with a gas to a pressure sufficient to generate and sustain a plasma discharge. The starting material is then vaporized to form a vapor deposit of the starting material on the substrate. In the presence of the plasma, a portion of the vaporized starting material becomes ionized, and the positively charged evaporant ions and positively charged gas ions are accelerated by the electric field and bombard the substrate surface to densify the vapor deposited coating. While the ion-plating process is useful in forming thick, dense, binderless coatings of conductive materials on conductive substrates, it cannot be used when either the coating material or the substrate is a relatively non-conductive material (e.g. photoconductive, semiconductive or dielectric materials). One finds that if the conductivity of either the coating material or the substrate is such that the positive charge build-up on the deposit (or on the substrate) causes the resulting potential to exceed approximately 40% of the applied potential, the requisite plasma discharge will be extinguished, thereby terminating the coating process. Furthermore, a DC generated plasma tends to produce pinholes or small voids in the deposited layer.

U.S. Pat. No. 3,419,487 to Robbins et al discloses a method of depositing thin film semiconductor coatings on a substrate wherein vaporized raw materials containing the necessary elements to form the desired semiconductor material are introduced into a reaction chamber. While the vaporized raw materials deposit on the substrate, an electric field is produced to attract electrons from a gas plasma or glow discharge toward the substrate surface. As the electrons bombard the substrate, they cause the vapor deposited materials to react on the substrate surface to form the desired semiconductor layer. While the electron bombardment process of Robbins may be effective to produce thin films of semiconductor materials, it is not suitable for forming thick, dense coatings since electrons, which are of extremely low mass, cannot provide sufficient bombardment force to densify the vapor deposit.

SUMMARY OF THE INVENTION

It is, therefore, an object of the invention to provide a method by which thick, dense, adhesive, cohesive, essentially non-porous, fine-grained layers of non-conductive materials can be formed on the surface of a substrate.

Another object of the invention is to provide a new method for producing photoconductive coatings which are stoichiometrically balanced as formed or can be stoichiometrically balanced by post-deposition treatment.

A more specific object of the invention is to provide a new method for forming a thick lead monoxide layer on a substrate.

These and other objects of the invention are accomplished by a method which comprises the steps of disposing a substrate, upon which a coating of a desired non-conductive material is to be formed, in the atmosphere of a preselected gas; establishing an RF electric field in the vicinity of the substrate to produce a plasma of said gas in the vicinity of the substrate, such plasma comprising a mixture of positively charged gas ions and electrons; electrically biasing the substrate to a negative potential sufficient to cause the charged gas ions to bombard the substrate; and depositing on the substrate a vapor containing atoms or molecules of the desired non-conductive material while the substrate undergoes bombardment of the charged gas ions. According to a preferred embodiment, an inorganic photoconductive material, preferably selected from the group consisting of the oxides of lead, antimony, bismuth, cadmium, tin and zinc, and the sulfides of antimony, bismuth, cadmium, and zinc, is vapor deposited onto the receiving substrate while the substrate undergoes bombardment by ions of an inert gas. According to another embodiment, a metal, preferably selected from the group consisting of lead, antimony, bismuth, cadmium, tin and zinc, is vaporized and the vapor thereof is deposited upon a receiving substrate while the substrate undergoes bombardment by oxygen ions which react with the vapor deposited metallic material to form an inorganic photoconductive oxide. According to still another embodiment, a metal, preferably selected from the group consisting of antimony, bismuth, cadmium and zinc, is vaporized and the vapor thereof deposited on a substrate while the substrate undergoes bombardment by hydrogen sulfide ions which react with the metal deposit to form a coating of an inorganic photoconductive sulfide on the substrate.

The invention, its objects and advantages will become more apparent to those skilled in the art by referring to the accompanying drawing and to the ensuing detailed description of the preferred embodiment.

BRIEF DESCRIPTION OF THE DRAWING

The FIGURE is a schematic view of apparatus in which the invention can be practiced.

DETAILED DESCRIPTION OF THE PREFERRED EMBODIMENT

With reference now to the schematic drawing, the reference numeral 10 designates a chamber which can be utilized for the practice of the invention. Chamber 10 is one of several commercially available units in which the technique of either evaporating deposition or sputtering deposition can be accomplished. More specifically, chamber 10 comprises a generally cylindrical shell 12, the ends of which are enclosed by a lower, electrically grounded cover 14 and an upper cover 16, as viewed in the drawing. Within chamber 10, a platinum crucible 18 is fixed to the cover 14 by a number of metallic studs and spacers 20, and is thereby electrically grounded. Crucible 18 includes a heating element 22, one terminal of which is connected to a power supply 24 and the other terminal of which is connected to ground, as indicated by the reference numeral 26. The cover 14 is provided with an outlet or conduit 28 in which a throttling valve 30 is positioned, the valve being connected via a conduit 31 to a suitable vacuum pump 32. The upper cover 16 carries an electrode 34 which is mounted by suitable posts 35 in a spaced and insulated relation to the cover 16 and in a spaced and aligned relation to the crucible 18. Electrode 34 is connectable, via switch S, to a radio-frequency (RF) power source 36 through a blocking capacitor 39. As will become apparent from the ensuing description, crucible 18 which, as mentioned above, is electrically grounded, functions as a counter-electrode in cooperating with electrode 34 to form a gas plasma. Power source 36 may be operated, for example, at 13.56 megahertz (MHz) at a power level between 50 and 2500 watts. Cover 16 is provided with a pressure gauge 38 for measuring the pressure in chamber 10, and a pair of feedlines 40 and 42 through which metered amounts of a preselected gas or gases can be introduced into the chamber. Adjustable flow valves 44 and 46 are arranged in feedlines 40 and 42, respectively, to control the flow of gas into the chamber.

To practice the invention, a substrate 52 which is to receive a coating in accordance with the method of the invention, is mounted in a suitable manner proximate, and preferably contiguous to, one surface of electrode 34. Substrate 52 may comprise any material, conductive or non-conductive, but preferably comprises a conductive substrate. To assist in dissipating heat from the vicinity of the substrate during the coating process, it is preferable that the substrate be mounted in good thermal contact with electrode 34 and that the latter be coupled to a heat sink. Pellets or small solid pieces of coating material 50, hereinafter referred to as starting material, are placed in crucible 18, and cover 16 is positioned to seal chamber 10. The chamber is then evacuated by the vacuum pump 32 to a relatively low pressure and back-filled through feedlines 40 and 42 with a preselected gas or gases to a pressure which will sustain a plasma discharge when the RF power source is connected to electrode 34 by switch S. The requisite partial pressure is maintained throughout the period of deposition by continuously admitting gas into the chamber 10 through the feedlines and by simultaneously and continuously evacuating the chamber through conduit 28.

Prior to the actual coating operation, it is desirable to subject the substrate to a cleaning step in order to remove contamination from the substrate surface which would otherwise adversely affect the adhesion between the coating the substrate. This cleaning step is accomplished by closing switch S, thereby applying the RF power source to electrode 34 and simultaneously creating a plasma 37 in the gas situated between electrode 34 and the grounded conductive cover 14. This plasma comprises a mixture of gas ions and free electrons. Owing to the presence of blocking capacitor 39, the free electrons will almost immediately bias electrode 34 to a negative potential, thereby rendering the electrode attractive to the positively-charged ions in the plasma. As these gas ions approach electrode 34, they are accelerated by the electric field gradient produced by the RF power source, the field being strongest adjacent the electrode. The result is that the relatively "massive" gas ions, "massive" in the sense that they are several orders of magnitude more massive than the electrons, bombard the surface 54 of substrate 52 with substantial momentum. Such ion bombardment acts to knock off any loose dirt particles and, in fact, etches away the exposed substrate surface. After a short time, the substrate surface is rendered atomically clean and receptive to the coating which is to be applied.

Upon cleaning the substrate surface, the current supplied to the heating element 22 by the heater power supply 24 is gradually increased to a level sufficient to cause melting and evaporation of the starting material 50. The vaporized starting material deposits on all surfaces within chamber 10, including surface 54 of substrate 52. During such deposition, the plasma-producing RF source remains connected to electrode 34, thereby producing continuous ion bombardment of the substrate. Such continuous ion bombardment acts to densify the vapor deposit on the substrate and renders it significantly more dense, cohesive, adhesive and non-porous than layers which are vapor deposited in the absence of ion bombardment. Note, unlike in the afore-described ion-plating process in which the DC field-produced plasma would be extinguished after only a very thin coating of a non-conductive material is vapor deposited on the receiving substrate, the gas plasma produced in accordance with the present invention will not self-extinguish, regardless of the thickness of the vapor deposit. The applied RF field continues to produce a plasma between electrode 34 and the counter electrode (grounded crucible 18) due to the partial charge neutralization which takes place every half cycle on the surface of the vapor deposit.

The current applied to the crucible 18 and the radio-frequency power applied to the electrode 34 are maintained at levels sufficient to sustain evaporation of the starting material 50 and generation of the gas plasma 37, respectively, until the starting material 50 is depleted from the crucible 18 or the evaporation is otherwise terminated. The geometrical form and arrangement of the gas plasma 37 in combination with evaporation of the material to be deposited serves to maintain the evaporated ionized atoms or molecules generally within the confines of the plasma 37 and to provide directional movement of these particles towards the support 52. Consequently, a thicker and more uniformly dense photoconductive layer is formed on the support 52 than has heretofore been possible with prior art techniques.

Upon depletion of the starting material 50, the application of the current to the heating element 22 and the application of radio-frequency power to the plasma-exciting electrode 34 is terminated, the admission of gas to the chamber 10 is discontinued and the chamber is then opened by admitting a dry gas such as nitrogen through the valve 46 in line 42 up to atmospheric pressure.

In order to produce photoconductive elements having very similar characteristics by successive plating operations, it has been found preferable to outgas the starting material 50 prior to the next plasma-plating operation.

As noted above, blocking capacitor 39 causes electrode 34 and conductive substrate 52 to self-bias to a negative potential so as to attract positively-charged ions from the gas plasma. Rather than using a blocking capacitor, a separate DC source could be used to bias the electrode negatively; however, the blocking capacitor is preferred from an economic standpoint. Further, it should be noted that neither a blocking capacitor nor a separate DC bias supply would be necessary in the event substrate 52 comprises a dielectric material, such as, for example, a glass plate. When substrate 52 is non-conductive, the free electrons in the gas plasma will continuously accumulate on and thereby charge the surface of the substrate to a negative potential, thereby attracting the positively-charged gas ions thereto. Further, it should be noted that it is not essential to the method of the invention that the starting material be vaporized in the vacuum chamber. Obviously, a vaporized starting material could be introduced into the chamber through one of the two feedlines 40 and 42.

The following examples serve to further illustrate the merits and practicality of the invention and to provide certain guidelines within which the invention might be practiced. It is to be understood, however, that the parameters and materials disclosed therein are merely illustrative and, hence, are not meant to limit the invention in any way.

EXAMPLE 1

A polished aluminum plate 52 about 5 centimeters (cm) square and 0.1 cm thick was centrally mounted on and in contact with a 12.5 cm diameter plasma-exciting electrode 34. The electrode 34 was also of aluminum and arranged in a substantially horizontal position. The plate 52 serves as a support on the polished, facing surface of which the plasma-plated photoconductive layer is to be deposited.

An evaporation source comprising a heated platinum crucible 18 filled with 1.2 grams of a commercial lead monoxide powder 50 (Fume Litharge, N. L. Industries) was spaced approximately 13 cm below the plate 52 and in a plane substantially parallel thereto. The lead monoxide starting material can also be supplied in the form of beads, chunks or plates of predominantly tetragonal or predominantly orthorhombic lead monoxide or a mixture of these lead monoxides. The chamber 10 containing the above-mentioned elements was evacuated to a pressure reading of $1\times 10^{-4}$ Torr, as indicated by the pressure gauge 38. After maintaining this pressure for a period of about 5 minutes, oxygen gas was admitted to the chamber 10 via the variable leak valve 44 in line 40 until a stable pressure reading of $3\times 10^{-2}$ Torr was obtained. This partial pressure reading was maintained by continuously admitting oxygen gas and by simultaneously and continuously evacuating the chamber 10 through the throttle valve 30 associated with the vacuum pump 32.

A gas plasma 37 was then established between the electrode 34, and by virtue of contact, the support 52, and the crucible 18 by application of a RF power level of 500 watts at an operating frequency of 13.56 MHz to the electrode 34. Following such exposure of the support 52 to the gas plasma 37 for about 5 minutes, evaporation of the lead monoxide starting material 50 into the gas plasma was begun by gradually increasing the current to the heater 22 from about 0 to about 180 amperes. This current level was sufficient to cause melting and evaporation of the lead monoxide starting material.

Both the current supplied to the heater 22 and the radio-frequency power supplied to the plasma-exciting electrode 34 were maintained at the above-noted values, respectively, until the lead monoxide starting material 50 was depleted from the crucible 18. Depletion was observed by the rapidly changing visual appearance of the color of the gas plasma 37. Following depletion of the lead monoxide starting material 50, the heater current and the radio-frequency power were shut off, oxygen admission to the chamber 10 was discontinued, and the chamber 10 was then opened by admitting nitrogen gas through leak valve 46 in line 42 up to atmosphereic pressure. The orange-brown layer deposited on the surface 54 of the plate 52 was determined by X-ray diffraction techniques to be composed of predominantly stoichiometrically balanced, orthorhombic lead monoxide. The layer so deposited was approximately 1.5 micrometers thick, appeared uniformly glossy and was free of the visibly discernible defects.

Adhesion of the lead monoxide layer to the plate 52 was determined qualitatively by a tape test in the following manner:

A strip of adhesive tape 6 cm long by 1 cm wide was placed on and pressed against the lead monoxide layer by rubbing under moderate finger pressure. The support plate 52 was secured against a table top in a horizontal position and the adhesive tape was pulled off the lead monoxide layer at an angle of approximately 60 degrees with respect to the horizontal plane. No lead monoxide deposit was removed by the adhesive tape. In fact, adhesion between the lead monoxide layer and the plate 52 was stronger than the bonding force between the tape per se and its adhesive layer. As a result, adhesive from the tape was noted on the lead monoxide layer, the tape adhesive having stripped itself from the tape. The tape adhesive could be removed from the lead monoxide layer by rinsing and wiping the layer with acetone solvent. Qualitatively, this degree of adhesion between the lead monoxide layer and plate 52 is deemed to be excellent.

EXAMPLE 2

The procedure of Example 1 was followed except that no radio-frequency power was applied to the electrode at any time during the process, thereby causing the deposition of the lead monoxide starting material to occur by conventional evaporation at an oxygen pressure reading of $3 \times 10^{-2}$ Torr. The yellow-green layer deposited on the surfface 54 of the plate 52 was determined by X-ray diffraction techniques to be composed of predominantly stoichiometrically balanced, orthorhombic lead monoxide. The layer was approximately 7 micrometers thick and appeared uniformly diffuse and powdery. The lead monoxide layer did not adhere to the support under the above-described tape test. In fact, the layer could be wiped off the plate 52 with soft tissue paper using only a minimal wiping action.

EXAMPLE 3

The procedure of Example 1 was followed except that the radio-frequency power imparted to the plasma-exciting electrode 34 was shut off approximately 3 minutes prior to depletion of the lead monoxide starting material 50 evaporating from the crucible 18. The yellow-green layer deposited on the one side of the support 52 was determined by X-ray diffraction techniques to be composed of predominantly stoichiometrically balanced, orthorhombic lead monoxide. The layer was approximately 2.6 micrometers thick and appeared uniformly diffuse and powdery. A powdery surface layer of approximately 1.5 micrometers thickness was removed by the tape test for adhesion. An orange sublayer revealed under the removed layer and was uniformly glossy. The tape test was applied to the sublayer and disclosed the sublayer had the same excellent adhesion characteristics as in Example 1.

EXAMPLE 4

The procedure of Example 1 was followed except that the radio-frequency power was not applied to the electrode until approximately 3 minutes prior to depletion of the lead monoxide starting material evaporating from the crucible 18. The orange-brown layer deposited on the plate 52 was determined by X-ray diffraction techniques to be composed of predominantly stoichiometrically balanced, orthorhombic lead monoxide. The layer was approximately 9 micrometers thick, appeared uniformly glossy and was free of visibly discernible defects. The tape test for adhesion resulted in sheet-like removal of a layer approximately 2 micrometers thick and having a glossy surface. A pale yellow, diffuse and powdery sublayer was disclosed under the removed layer. The sublayer did not adhere to the plate 52, as evidenced by a second tape test for adhesion. In fact, the diffuse sublayer could be wiped off of the plate 52 with soft tissue paper using only a minimal wiping action.

Examples 1-4 demonstrate the criticality of establishing and maintaining a radio-frequency gas plasma prior to and throughout the period of material deposition. A lead monoxide layer applied during the absence of the gas plasma does not adhere to the support (Example 2). A lead monoxide layer deposited in the absence of a gas plasma will not adhere to the support even though the gas plasma is subsequently established prior to depletion of the starting material from the crucible (Example 4); and a lead monoxide layer deposited in the absence of a gas plasma is easily removed from a highly adhering layer previously applied with a gas plasma (Example 3).

EXAMPLE 5

The procedure of Example 1 was followed except that the evaporation source was replaced by a higher capacity unit comprising a larger crucible heater and an aluminum oxide crucible filled with 20 grams of commercial lead monoxide powder. This larger evaporation source required a crucible heater current of approximately 270 amps in order to properly sustain melting and evaporation of the lead monoxide starting material. Using a pressure reading, radio-frequency power, and time intervals as in Example 1, depletion of the lead monoxide starting material 50 from the crucible was complete 14 minutes after onset of evaporation into the radio-frequency excited gas plasma 37. A uniformly glossy, green-yellow layer was deposited on the plate 52 and was determined by X-ray diffraction techniques to be composed of predominantly stoichiometrically balanced, orthorhombic lead monoxide. The layer was approximately 90 micrometers thick and exhibited excellent adherence to the plate 52, as indicated by the tape test for adhesion. The glossy surface was not visibly abraded after rubbing it with dry, tissue paper under substantial force. The layer did not change its physical appearance or adhesion characteristics following immersion for 2 hours in acetone solvent and immersion for 2 hours in isopropyl alcohol.

In order to provide means for photoelectric characterization of the lead monoxide layer, a circular, semi-transparent, gold electrode of 1 cm$^2$ area was centrally deposited on the lead monoxide layer through a mask by conventional vacuum evaporation techniques. The plate 52 representing one conductive electrode member was connected to a variable (0 to +100 volts) source of electrical potential, while the evaporated gold electrode was connected to a current meter via a fine, spring-loaded wire contact. On application of an electrical potential of about 10 volts to the plate 52, the current meter indicated a dark current of $4\times10^{-6}$ amps. When the gold electrode was illuminated with light from a microscope illuminator placed 15 cm from the electrode, the current reading increased to $8\times10^{-6}$ amps.

EXAMPLE 6

In order to reduce the dark current conductance of the photosensitive lead monoxide layers prepared in accordance with the teachings of the invention, the lead monoxide coated plate with the gold electrode, as described in Example 5, was placed in a substantially horizontal position in a 7.5 cm diameter quartz tube having provisions for flushing with nitrogen gas or with air. The quartz tube was inserted into an electric furnace and nitrogen gas from a cylinder was admitted to the quartz tube flowing through the tube at a rate of approximately 0.3 liters per minute. The furnace temperature was set to 600° C. and remained at this temperature for 6 hours at which time the furnace was shut off. The quartz tube was removed from the furnace after the temperature had decreased to 200° C. and at this time the nitrogen gas flow through the tube was terminated. The lead monoxide coated support was removed from the tube and allowed to cool at room temperature. The lead monoxide layer was then subjected to the electrical characterization procedure described in Example 5. Under an applied electrical potential of 100 volts, a dark current reading of approximately $1\times10^{-11}$ amps was obtained. By illuminating the gold electrode, as in Example 5, the current was increased to $2\times10^{-6}$ amps. Periodic interruption of the light beam resulted in periodic current fluctuation, the lead monoxide layer between the two electrode members acting as an effective photoconductive transducer between light input and electrical signal output.

EXAMPLE 7

Example 1 was repeated except that argon gas was admitted to the chamber at a pressure reading of $5\times10^{-3}$ Torr and the radio-frequency power lever was set at 100 watts. The blue-black layer deposited on the surface 54 of the plate 52 was approximately 13 micrometers thick, appeared uniformly glossy and was free of visibly discernible defects. Adherence of the coating to the support was excellent, as indicated by the tape test for adhesion.

EXAMPLE 8

A glass plate 5 cm$\times$5 cm$\times$0.15 cm thick having a transparent conductive film on one surface, was centrally mounted on the electrode 34 in a substantially horizontal, mechanically contacting manner, such that the conductive film was facing the crucible 18 which was located approximately 13 cm below the glass plate. A second plate, of quartz, was mounted adjacent the glass plate. The dimensions of the quartz plate were 2 cm$\times$1 cm$\times$0.1 cm thick. An interdigital electrode pattern of titanium gold composition was deposited on one surface of the quartz plate. The pattern comprises two interlocking but non-contacting arrays of comb-like conductive fingers to provide a set of 7 equally spaced gaps between the fingers. The gap spacing was approximately 0.3 millimeters. The quartz plate was fixed to the electrode 34 such that the interdigital pattern faced the evaporation source of crucible 18. Example 1 was repeated except that oxygen gas was admitted to the chamber to provide a pressure reading of $6\times10^{-3}$ Torr. The radio-frequency power that was applied to the electrode 34 was 125 watts.

The uniformly glossy, orange-brown layer deposited on one side of each of the two plates was approximately 7 micrometers thick and specularly transparent under room light. Adherence of each lead monoxide layer to its respective support was excellent, as evidenced by the tape test for adhesion. The lead monoxide layer deposited on the second plate carrying the interdigital electrode pattern was characterized photoelectrically by means of its current voltage relationship in the dark and under illumination, as outlined in Example 5. On application of an electrical potential of 100 volts, a dark current reading of $1\times10^{-7}$ amps was obtained. By illuminating the layer from either side with light, as in Example 5, the current reading increased to $2\times10^{-5}$ amps. Periodic interruption of the light beam resulted in virtually simultaneous periodic fluctuation of the measured current, the fluctuation occurring essentially between $1\times10^{-7}$ amps and $2\times10^{-5}$ amps.

EXAMPLE 9

Two support plates, as in Example 8, were mounted on the electrode 34. The plasma-plating procedure of Example 1 was followed except that a radio-frequency power of 125 watts was used. Also, oxygen gas and argon gas were simultaneously admitted to the chamber 10 via valves 44, 46, such that a first pressure reading of $5\times10^{-3}$ Torr was established for the oxygen gas alone and a second pressure reading of $2\times10^{-2}$ Torr was obtained with admission of the argon gas.

The uniformly diffuse, dark brown layer on each of the support plates was approximately 6 micrometers thick and translucent under room light. The tape test for adhesion indicated that a thin, diffuse surface layer did not adhere strongly to a glossy transparent sublayer of approximately 5 micrometers thickness. On the other hand, the sub-layer had excellent adhesion to its respective support plate. The lead monoxide layer deposited on the support carrying the interdigital electrode pattern was characterized photoelectrically as in Example 8. A dark current reading of $1.6\times10^{-9}$ amps was obtained with an applied electrical potential of 100 volts. Under illumination, the current increased to $4.5\times10^{-9}$ amps. This layer was then subjected to heat treatment, as in Example 6, except the temperature was held at 400° C. for 4 hours. Upon cooling to room temperature, the coating was again characterized photoelectrically. Upon application of an electrical potential of 100 volts, a dark current reading of $3.5\times10^{-10}$ amps and a reading under illumination of $1.5\times10^{-8}$ amps was obtained, respectively.

EXAMPLE 10

A polished aluminum plate 52 was mounted as in Example 1, to serve as a support on which a plasma-plated lead monoxide layer was to be deposited.

An evaporation source comprising a crucible heater and a platinum micro-crucible was arranged in a plane parallel to and spaced approximately 7 cm below the support. The crucible 18 was filled with 2.3 grams of commercial lead monoxide powder. A plate 34 of stainless steel, 25 cm in diameter and having a centrally located hole of 3 cm diameter, was positioned 4.2 cm below and substantially parallel to the support and was electrically connected to ground, the central hole being located in alignment with the crucible. The chamber 10 containing the above elements was evacuated to a pressure reading of about $1.2 \times 10^{-5}$ Torr, as indicated by the pressure gauge 38. After maintaining this pressure reading for about 5 hours, moisturized air was admitted to the chamber 10 via the variable leak valve 44 in line 40 until a stable pressure reading of $8 \times 10^{-2}$ Torr was attained. The room-ambient air was drawn through filter paper placed over the input tubing of a conventional wash bottle that was filled with distilled water. The air had to pass through the water in the form of a multiplicity of small bubbles prior to admission into the chamber.

A gas plasma was then established in the chamber 10 by applying a radio-frequency power level of approximately 50 watts to the plasma-exciting electrode 34. Upon initiation of the plasma, the variable leak valve 44 was closed slightly, resulting in a stable pressure reading of $3 \times 10^{-2}$ Torr. The radio-frequency power was then increased to and maintained at 250 watts. The support 34 was exposed to the gas plasma for 13 minutes, during which period the heater current to the crucible heater was gradually increased to 140 amperes. This current level was sufficient to cause melting and evaporation of the lead monoxide starting material contained in the crucible 18.

The crucible heater current and the radio-frequency power imparted to the plasma-exciting electrode were maintained at the above-noted values for a period of approximately 270 seconds and were then turned off. Admission of the moisturized air was also discontinued at this same time. Nitrogen gas was then admitted to chamber 10 through leak valve 46 in line 42 as the chamber returned to atmospheric pressure.

The layer deposited on the support was 47 micrometers thick, highly glossy and of orange-brown appearance. A circular semi-transparent gold electrode was deposited on the layer, and photoelectric characterization proceeded as in Example 5. With the positive terminal of the potential source connected to the support, an applied electrical potential of 10 volts indicated a dark current of $4 \times 10^{-8}$ amperes by a current meter. Upon illumination of the layer through the semi-transparent gold electrode, the current reading increased to $3.2 \times 10^{-6}$ amperes.

Periodic interruption of illumination resulted in virtually simultaneous periodic fluctuations of current level, the fluctuations ranging from approximately $6 \times 10^{-8}$ amperes to approximately $3 \times 10^{-6}$ amps.

EXAMPLE 11

The apparatus of Example 1 was utilized except that the evaporation source was a tungsten crucible 18 heated by an In Source 1500 $^R$ induction coil manufactured by Applied Materials Corporation and a rotatable shutter (not shown in the drawing) was interposed between the crucible and the substrate 52. The crucible was filled with 41 grams of high purity lead, the shutter was closed, the chamber was evacuated to a pressure reading of about $2 \times 10^{-5}$ Torr, as indicated by the gauge 38, and current was supplied to the coil from the power supply 24 at a level sufficient to melt the lead. The current to the coil was then decreased to a value below the melting point of the lead and oxygen gas was admitted to the chamber via the variable leak valve 44 in line 40 until a stable pressure reading of $3 \times 10^{-3}$ Torr was obtained. This partial pressure reading was maintained by continuously evacuating the chamber 10 through the throttle valve 30 associated with the vacuum pump 32.

A gas plasma 37 was then established in the chamber by application of a RF power level of 200 watts at an operating frequency of 13.56 MHz to the plasma-exciting electrode 34. After 10 minutes, the shutter was opened and the current to the coil gradually increased until the lead began evaporating at a desired rate as indicated on a quartz crystal monitor placed to the side of the substrate 52.

After 100 minutes the shutter was closed and the current to the coil was reduced to zero. Thirty seconds later the plasma was extinguished. After allowing about 60 minutes for the crucible to cool, nitrogen gas was admitted to chamber 10 through leak valve 46 in line 42 as the chamber returned to atmospheric pressure.

The layer deposited on the substrate was approximately 45 micrometers thick and gray in color. The adherence of the coating to the substrate was tested as described in Example 1 and found to be excellent. Microscopic examination of a fractured cross-section of the coating revealed a particularly fine-grained structure substantially devoid of pinholes and other coating defects.

For photoelectric characterization of the coating, a circular, semi-transparent gold electrode of 1 cm$^2$ was deposited onto the coating through a mask by conventional vacuum evaporation techniques. The application of an electric potential of 1 volt between the gold electrode and the aluminum substrate 52 with the substrate either positive or negative resulted in a current flow of $2 \times 10^{-5}$ amps with the coating either in the dark or illuminated by approximately 600 foot-candles of light. The coating was then fired in air for 16 hours at 320° C. and for 16 hours at 385° C. During firing, the color of the coating changed from gray to reddish-brown. After firing, the application of a potential of 100 volts between the gold electrode and the aluminum substrate 52 with the substrate positive resulted in a current flow of $6 \times 10^{-9}$ amps with a coating in the dark and a current flow of $3 \times 10^{-6}$ amps with a coating illuminated by $2 \times 10^{13}$ photons/cm$^2$ sec. having a wavelength of 611 nanometers. The quantum efficiency for the photocurrent was thus 94%.

EXAMPLE 12

The procedure of Example 11 was followed except that the crucible contained approximately 104 grams of high purity lead and the gas within the chamber 10 during the deposition process was a mixture of 80% oxygen and 20% argon at a total pressure of $7 \times 10^{-3}$ Torr. The coating as deposited on the substrate 52 was approximately 50 micrometers thick and gray in color. The adherence of the coating to the substrate was tested as described in Example 1 and found to be excellent. A fractured cross-section of the coating was examined under a microscope and found to be of particularly fine-grained structure. A semi-transparent, circular, gold electrode of approximately 0.16 cm$^2$ area was deposited onto the coating by a vacuum evaporation technique. The application of an electric potential of 100 volts between the gold electrode and the aluminum substrate 52 with the substrate positive resulted in a current of $1.6 \times 10^{-4}$ amps with the coating in the dark or with the sample illuminated by approximately 900 foot candles of light. The coating was then fired in air for 16 hours at 315° C. and for 16 hours at 360° C. During firing, the color of the coating changed from gray to reddish-brown. After firing, the application of voltage as described above resulted in a current flow of $2.5 \times 10^{-8}$ amps with the coating in the dark and a current flow of $1 \times 10^{-6}$ amps with the coating illuminated by $2 \times 10^{13}$ photons/cm$^2$ sec. having a wavelength of 611 nanometers. The quantum efficiency for the photocurrent is thus 195%.

From the foregoing, the advantages of the present invention are readily apparent. Usefully thick, binderless, dense and cohesive photoconductive lead monoxide coatings can now be prepared using equipment readily available in the art. The photoconductive coatings have a low dark conductance, a high spacial frequency response and have excellent stability of electrical properties over long periods of use under ambient conditions.

The invention has been described in detail with particular reference to preferred embodiments thereof but it will be understood that variations and modifications can be effected with in the spirit and scope of the invention. For example, any structurally adequate dielectric, semi-conductive or conductive material which can tolerate temperatures of up to approximately 400° C. can be used as the substrate or support 52 on which the photoconductive layer is deposited. Also, by proper choice of evaporation conditions and plasma gases, other photoconductive materials can be deposited with similar results, e.g., the oxides of antimony, bismuth, cadmium, tin and zinc and the sulfides of antimony, bismuth, cadmium and zinc.

We claim:

1. A method for forming on the surface of a substrate a dense, photoconductive layer of stoichiometrically balanced lead oxide, said method comprising the steps of:
   (a) disposing the substrate in an atmosphere of a gas comprising a mixture of oxygen and an inert gas;
   (b) establishing an RF electric field in the vicinity of the substrate surface to produce a plasma of the gas in the vicinity of the substrate surface, such plasma comprising a mixture of positively charged gas ions and electrons;
   (c) electrically biasing the substrate to cause the positively charged gas ions to bombard the substrate surface; and
   (d) depositing on the substrate surface a vapor of lead oxide while the surface undergoes bombardment by said gas ions.

2. A method for forming on the surface of a substrate a photoconductive layer of stoichiometrically balanced lead oxide, said method comprising the steps of:
   (a) disposing the substrate in an atmosphere of an oxygen-containing gas at a predetermined pressure;
   (b) establishing an RF electric field in the vicinity of the substrate surface to produce a plasma of the oxygen gas in the vicinity of the substrate surface, such plasma comprising a mixture of positively charged oxygen gas ions and electrons;
   (c) electrically biasing the substrate to cause the positively charged oxygen gas ions to bombard the substrate surface; and
   (d) depositing on the substrate surface a vapor of substantially pure lead while the surface undergoes bombardment by said oxygen gas ions.

3. A method for forming on the surface of a substrate a dense layer of a photoconductive material, said method comprising the steps of:
   (a) disposing the substrate in an atmosphere of a preselected gas at a predetermined pressure;
   (b) establishing an RF electric field in the vicinity of the substrate surface to produce a plasma of the gas in the vicinity of the substrate surface, such plasma comprising a mixture of positively charged gas ions and electrons;
   (c) electrically biasing the substrate to cause the positively charged gas ions to bombard the substrate surface;
   (d) depositing on the substrate surface a vapor of the photoconductive material while the surface undergoes bombardment by the gas ions, whereby a dense layer of photoconductive material is formed; and
   (e) post-firing the layer deposited on the substrate surface in an inert gas environment to a temperature of at least 400° C.

4. A method for forming on the surface of a substrate a dense layer of a photoconductive material, said method comprising the steps of:
   (a) disposing the substrate in an atmosphere of a preselected gas at a predetermined pressure;
   (b) establishing an RF electric field in the vicinity of the substrate surface to produce a plasma of the gas in the vicinity of the substrate surface, such plasma comprising a mixture of positively charged gas ions and electrons;
   (c) electrically biasing the substrate to cause the positively charged gas ions to bombard the substrate surface;
   (d) depositing on the substrate surface a vapor of the photoconductive material while the surface undergoes bombardment by the gas ions, whereby a dense layer of photoconductive material is formed; and
   (e) post-firing the layer deposited on the substrate surface in an oxygen-containing environment to a temperature of at least 300° C.

5. A method for forming on the surface of a substrate a layer of a photoconductive metal oxide, said method comprising the steps of:
   (a) disposing the substrate in the atmosphere of oxygen-containing gas at a predetermined pressure;
   (b) establishing an RF field in the vicinity of said surface to produce a plasma of said gas in the vicinity of said surface, such plasma comprising a mixture of positively charged oxygen ions and electrons;
   (c) electrically biasing the substrate to a negative potential to cause such positively charged oxygen ions to bombard said surface;
   (d) depositing on said surface a vapor containing molecules of the metal component of said metal oxide while the substrate undergoes bombardment by oxygen ions, said oxygen ions reacting with said metal molecules to form said photoconductive material on the substrate surface; and
   (e) post-firing the layer deposited on the substrate surface in an inert gas environment to a temperature of at least 400° C.

6. The method according to claim 5 wherein the metal oxide is selected from the group consisting of the oxides of lead, antimony, bismuth, cadmium, tin and zinc, and the sulfides of antimony, bismuth, cadmium and zinc.

7. A method for forming on the surface of a substrate a layer of a photoconductive metal oxide, said method comprising the steps of:
   (a) disposing the substrate in the atmosphere of oxygen-containing gas at a predetermined pressure;
   (b) establishing an RF field in the vicinity of said surface to produce a plasma of said gas in the vicinity of said surface, such plasma comprising a mixture of positively charged oxygen ions and electrons;
   (c) electrically biasing a substrate to a negative potential to cause such positively charged oxygen ions to bombard said surface;
   (d) depositing on said surface a vapor containing molecules of the metal component of said metal oxide while the substrate undergoes bombardment by oxygen ions, said oxygen ions reacting with said metal molecules to form said photoconductive material on the substrate surface; and
   (e) post-firing the layer deposited on the substrate surface in an oxygen-containing environment to a temperature of at least 300° C.

8. The method according to claim 7 wherein the metal oxide is selected from the group consisting of the oxides of lead, antimony, bismuth, cadmium, tin and zinc, and the sulfides of antimony, bismuth, cadmium and zinc.

* * * * *